(12) United States Patent
Yang et al.

(10) Patent No.: US 12,218,060 B2
(45) Date of Patent: Feb. 4, 2025

(54) INTEGRATED CHIP WITH GRAPHENE BASED INTERCONNECT

(71) Applicant: Taiwan Semiconductor Manufacturing Co., Ltd., Hsin-Chu (TW)

(72) Inventors: Shin-Yi Yang, New Taipei (TW); Meng-Pei Lu, Hsinchu (TW); Chin-Lung Chung, Hsin-Chu (TW); Ming-Han Lee, Taipei (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 386 days.

(21) Appl. No.: 17/308,361

(22) Filed: May 5, 2021

(65) Prior Publication Data

US 2022/0359413 A1  Nov. 10, 2022

(51) Int. Cl.
*H01L 23/522* (2006.01)
*H01L 21/3105* (2006.01)
(Continued)

(52) U.S. Cl.
CPC .. *H01L 23/53276* (2013.01); *H01L 21/31053* (2013.01); *H01L 21/7682* (2013.01);
(Continued)

(58) Field of Classification Search
CPC ......... H01L 23/53276; H01L 21/31053; H01L 21/7682; H01L 21/76834; H01L 21/76877;
(Continued)

(56) References Cited

U.S. PATENT DOCUMENTS 9,293,412 B2 *  3/2016  Bao ................... H01L 21/76871
11,515,201 B2 * 11/2022  Ahn .................... H01L 21/7682
(Continued)

OTHER PUBLICATIONS

Lienig et al. "Fundamentals of Electromigration-Aware Integrated Circuit Design." Chapter 2: Fundamentals of Electromigration, published in 2018.
(Continued)

*Primary Examiner* — Fernando L Toledo
*Assistant Examiner* — Jahae Kim
(74) *Attorney, Agent, or Firm* — Eschweiler & Potashnik, LLC

(57) ABSTRACT

The present disclosure relates to an integrated chip. The integrated chip includes a substrate. A first conductive feature is over the substrate. A second conductive feature is over the substrate and is adjacent to the first conductive feature. The first and second conductive features are separated by a cavity. A dielectric liner extends from the first conductive feature to the second conductive feature along a bottom of the cavity and further extends along opposing sidewalls of the first and second conductive features. A dielectric cap covers and seals the cavity. The dielectric cap has a top surface that is approximately planar with top surfaces of the first and second conductive features. The first conductive feature and the second conductive feature comprise graphene intercalated with one or more metals.

20 Claims, 15 Drawing Sheets

(51) Int. Cl.
*H01L 21/768* (2006.01)
*H01L 23/532* (2006.01)

(52) U.S. Cl.
CPC .. *H01L 21/76834* (2013.01); *H01L 21/76877* (2013.01); *H01L 21/76886* (2013.01); *H01L 23/5226* (2013.01); *H01L 23/53295* (2013.01)

(58) Field of Classification Search
CPC ........... H01L 21/76886; H01L 23/5226; H01L 23/53295; H01L 21/76832; H01L 21/76844; H01L 21/76885; H01L 23/5222; H01L 21/76837
See application file for complete search history.

(56) References Cited

U.S. PATENT DOCUMENTS

| | | | |
|---|---|---|---|
| 2005/0118796 A1* | 6/2005 | Chiras | H01L 21/76805 438/618 |
| 2010/0093168 A1* | 4/2010 | Naik | H01L 21/76834 438/618 |
| 2014/0284798 A1* | 9/2014 | Miyazaki | H01L 23/53276 257/750 |
| 2021/0125856 A1* | 4/2021 | Ahn | H01L 21/76834 |

OTHER PUBLICATIONS

Chen, Xiangyu. "Application of Graphene in Integrated Circuit Interconnect Technology." Standford University, published Nov. 2012.

Yoon et al. "Improved Electromigration-RAug. 27, 2015esistance of Cu Interconnects by Graphene-Based Capping Layer." IEEE 2015 Symposium on VLSI Technology (VLSI Technology). Published on Aug. 27, 2015.

Li et al. "In-Situ Grown Graphene Enabled Copper Interconnects With Improved Electromigration Reliability." IEEE Electron Device Letters, vol. 40, No. 5, published May 2019.

Chen et al. "Advances in transferring chemical vapour deposition graphene: a review." The Royal Society of Chemistry, Mater. Horiz., 2017, 4, 1054-1063, published on Aug. 18, 2017.

Song et al. "Iron (III) Chloride doping of CVD graphene." Nanotechnology 25 (2014) 395701 (8pp), published on Sep. 5, 2014.

Mah et al. "Graphene." University of Calgary, published on Jun. 4, 2018.

\* cited by examiner

INTEGRATED CHIP WITH GRAPHENE BASED INTERCONNECT

BACKGROUND

Modern day integrated chips contain millions of semiconductor devices. The semiconductor devices are electrically interconnected by way of back-end-of-the-line (BEOL) metal interconnect layers that are formed above the devices on an integrated chip. A typical integrated chip comprises a plurality of BEOL metal interconnect layers including different sized metal wires vertically coupled together with metal vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
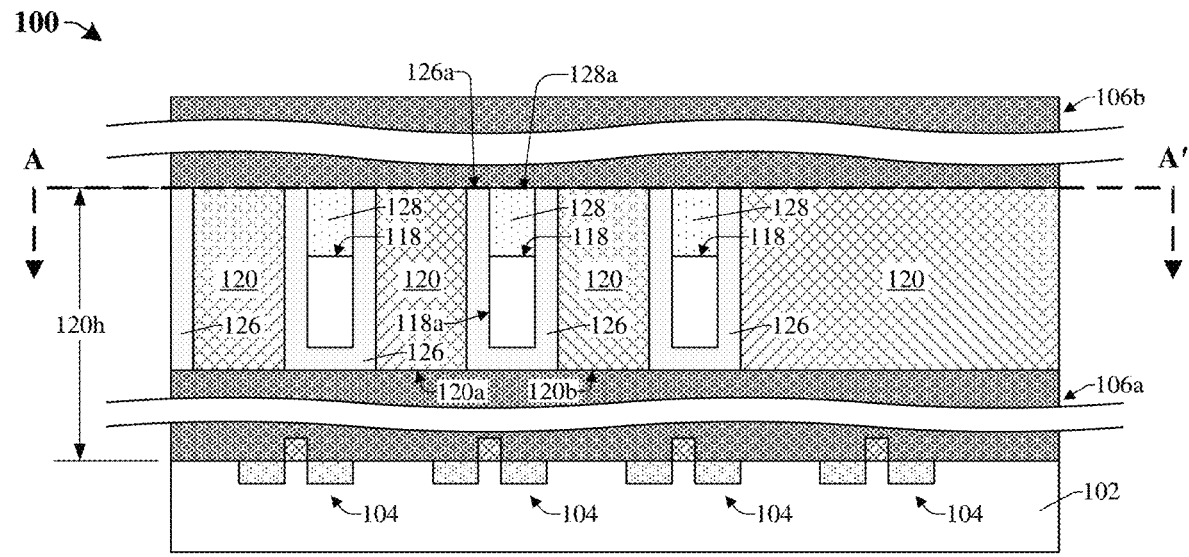
FIG. 1 illustrates a cross-sectional view of some embodiments of an integrated chip including a first wire and a second wire that comprise graphene.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips include a plurality of wires and a plurality of vias. The wires and the vias are alternatingly stacked over a substrate to define conductive paths that may be electrically connected to one or more semiconductor devices on the substrate. The wires and the vias comprise metal and extend through a dielectric structure. The metal may, for example, be or comprise copper, aluminum, or the like. Further, the wires and the vias may have diffusion barriers to prevent outward diffusion. The dielectric structure may, for example, be or comprise silicon oxide and/or other suitable dielectric(s).

A challenge with the wires and the vias is that the wires and the vias may have high resistance(s). For example, the wires and the vias may have high resistances when copper because of the high resistivity of copper (e.g., about 17 $\mu\Omega\times mm$). In addition, the diffusion barriers may vertically separate wires from overlying vias and may hence increase a contact resistance between the wires and the overlying vias. Further, a challenge with the dielectric structure is that the dielectric structure may have a high dielectric constant and hence a capacitance between neighboring wires may be high. For example, silicon oxide may be used to separate wires and has a high dielectric constant of about 3.9. Furthermore, because of the high resistance of the wires and the high capacitance between the neighboring wires, a power efficiency of the integrated chip may be low and/or resistive-capacitive (RC) delay of the integrated chip may be high.

Additional challenges with the wires and the dielectric structure are low reliability. In some instances, a reliability of the wires may be low due to electromigration. For example, the wires may have a low current density at which electromigration may occur when copper (e.g., about $10^6$ $A/cm^2$), such that the likelihood of electromigration is high and hence reliability is low. Further, a reliability of the dielectric structure may be low due to metal diffusing to the dielectric structure from the wires and/or the vias despite the diffusion barriers. For example, metal that diffuses to the dielectric structure may lead to a quicker time-dependent dielectric breakdown (TDDB) of the dielectric structure.

Various embodiments of the present disclosure are related to an integrated chip including a first wire and a second wire that comprise graphene for improving a performance and reliability of the integrated chip. The first and second wires are disposed over a substrate. The second wire is laterally adjacent to the first wire and is laterally separated from the first wire by a dielectric liner, a dielectric cap, and a cavity. The dielectric liner extends from the first wire to the second wire along a bottom of the cavity, such that an upper surface of the dielectric liner defines the cavity. The dielectric liner further extends along opposing sidewalls of the first and second wire, such that dielectric liner further defines the cavity. The dielectric cap covers and seals the cavity, such that a bottom surface of the dielectric cap further defines the cavity. The cavity has a low dielectric constant and may, for example, be filled with air, nitrogen, oxygen, or some other suitable gas. Further, the first and second wires comprise graphene that is intercalated with one or more metals.

By including the graphene in the first and second wires, resistances of the first and second wires may be low. For example, the first and second wires may have low resistances because graphene has a low resistivity (e.g., about 10 μΩ×mm or some other suitable value). Further, by including the cavity between the first and second wires, the first and second wires are separated by an insulating region that has a low dielectric constant. For example, when the cavity comprises air, the insulating region may have a low dielectric constant of about 1 or some other suitable value. Thus, a capacitance between the first and second wires may be low. Because of the low resistance and the low capacitance, a power efficiency, an RC delay, and other suitable performance metrics of the integrated chip may be enhanced.

In addition, by including the graphene in the first and second wires and by including the cavity between the first and second wires, a reliability of the first and second wires and a reliability of the insulating region between the first and second wires may be high. For example, because graphene has a high current density at which electromigration may occur (e.g., about $10^8$ A/cm$^2$ or some other suitable value), the likelihood of electromigration is low and hence a reliability of the first and second wires is high. Further, because graphene comprises strong carbon-carbon covalent bonding, the likelihood of the first and second wires diffusing into the insulating region is low. Furthermore, the cavity is not susceptible to diffusing material. Thus, a reliability of the insulating region between the first and second wires is high. For example, a TDDB of the insulating region may be slowed.

Figure 2:
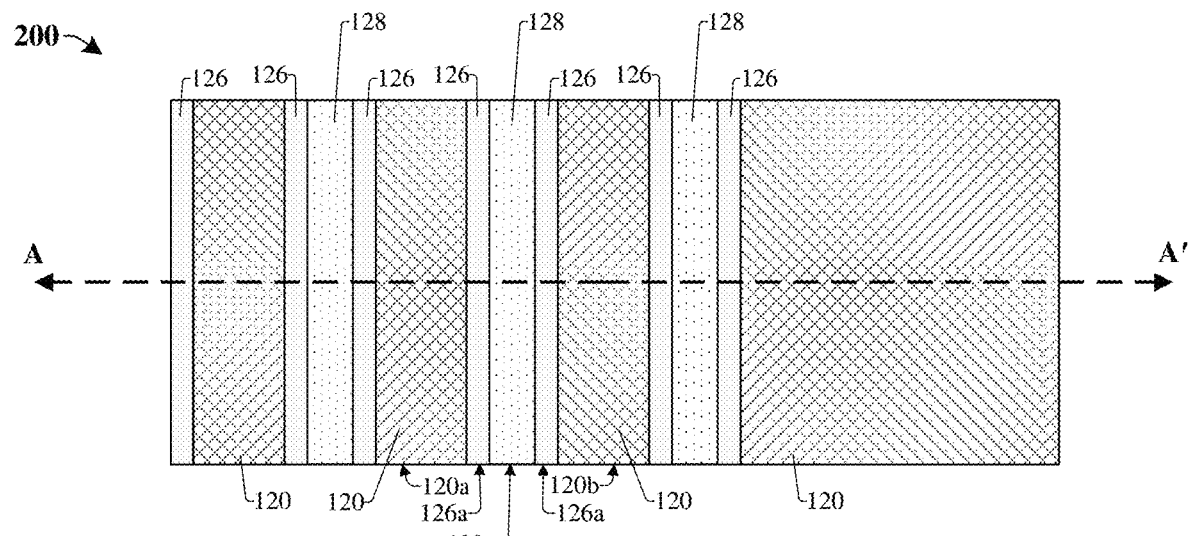
FIG. 2 illustrates a top view of some embodiments of the integrated chip of FIG. 1.

Referring to FIGS. 1 and 2 simultaneously, FIG. 1 illustrates a cross-sectional view 100 of some embodiments of an integrated chip including a first wire 120a and a second wire 120b that comprise graphene, and FIG. 2 illustrates a top view 200 of some embodiments of the integrated chip of FIG. 1. The cross-sectional view 100 of FIG. 1 may, for example, be taken across line A-A' of FIG. 2.

In such embodiments, one or more semiconductor devices 104 are disposed along an upper surface of a substrate 102. A first interconnect structure 106a may be over the upper surface of the substrate 102. The first interconnect structure 106a may, for example, comprise one or more contacts, one or more wires, one or more vias, or some other conductive features that may be electrically connected to the one or more semiconductor devices.

In addition, a plurality of wires 120 are over the substrate 102 at a first height 120h over the substrate 102. The plurality of wires 120 are laterally separated by a plurality of cavities 118, a plurality of dielectric liners 126, and a plurality of dielectric caps 128.

For example, the first wire 120a and the second wire 120b are over the substrate 102 at the first height 120h. The first wire 120a is laterally adjacent to the second wire 120b and the first wire 120a is laterally separated from the second wire 120b by a first dielectric liner 126a, a first dielectric cap 128a, and a first cavity 118a.

The first dielectric liner 126a is on opposing sidewalls of the first and second wires 120a, 120b such that opposing sidewalls of the first dielectric liner 126a define sides of the first cavity 118a. The first dielectric liner 126a also extends laterally between the opposing sidewalls of the first and second wires 120a, 120b along a bottom of the first cavity 118a such that an upper surface of the first dielectric liner 126a defines a bottom of the first cavity 118a.

The first dielectric cap 128a covers and seals the first cavity 118a. The first dielectric cap 128a overlies the first cavity 118a and extends laterally between the opposing sidewalls of the first dielectric liner 126a such that a bottom surface of the first dielectric cap 128a defines a top of the first cavity 118a.

The plurality of cavities 118 may, for example, be filled with air, oxygen, nitrogen, or some other suitable gas. Thus, the plurality of cavities 118 have a low dielectric constant (e.g., about 1 when filled with air). By including the first cavity 118a between the first wire 120a and the second wire 120b, a capacitance between the first wire 120a and the second wire 120b may be low.

The first wire 120a and the second wire 120b comprise graphene intercalated with any of iron, cobalt, nickel, silver, gold, molybdenum, copper, or some other suitable metal. Thus, the first wire 120a and the second wire 120b have a low resistance and/or resistivity because of the low resistivity of graphene (e.g., about 10 μΩ×mm or some other suitable value). In some embodiments, the first wire 120a and the second wire 120b have a resistivity of about 10 to 1000 μΩ×mm or some other suitable value. For example, in some embodiments, the first wire 120a and the second wire 120b have a resistivity that is less than a resistivity of silver (e.g., about 16 μΩ×mm).

Due to the low resistance of the first wire 120a and the second wire 120b, and further due to the low capacitance between the first wire 120a and the second wire 120b, a power efficiency, an RC delay, and other suitable performance metrics of the integrated chip may be enhanced.

Further, because graphene has a high current density at which electromigration occurs (e.g., about $10^8$ A/cm$^2$ or some other suitable value), the likelihood of electromigration occurring in the first wire 120a and/or the second wire 120b is low. Thus, a reliability of the first wire 120a and the second wire 120b is high. For example, a current density at which electromigration may occur in the first wire 120a and/or the second wire 120b may be at least about 10 times greater than a current density at which electromigration may occur in a copper wire. Thus, a reliability of the first wire 120a and the second wire 120b may be substantially higher than that of a copper wire.

Furthermore, because graphene comprises strong carbon-carbon covalent bonding, the likelihood of the first wire 120a and/or the second wire 120b diffusing into the first dielectric liner 126a is low. In addition, the first cavity 118a is not susceptible to diffusing material. Thus, a reliability of an insulating region (e.g., a region comprising the first dielectric liner 126a, the first dielectric cap 128a, and the first cavity 118a) between the first wire 120a and the second wire 120b is high. For example, TDDB may be low.

In some embodiments, a second interconnect structure 106b may be disposed over the plurality of wires 120. The second interconnect structure 106b may, for example, comprise one or more wires, one or more vias, one or more bond pads, or some other suitable conductive features. The second interconnect structure 106b may be electrically connected to any of the one or more semiconductor devices 104 through any of the plurality of wires 120 and the first interconnect structure 106a.

The substrate 102 may, for example, comprise silicon, some other semiconductor, or the like. The plurality of semiconductor devices 104 may, for example, be any of a metal-oxide-semiconductor field-effect transistor (MOSFET), a bipolar junction transistor (BJT), a junction field-effect transistor (JFET), an insulated gate bipolar transistor (IGBT), a fin field-effect transistor (FinFET), a gate-all-around field-effect transistor (GAA FET), or the like.

The plurality of dielectric liners 126 may, for example, comprise silicon oxycarbide, silicon oxynitride, aluminum nitride, aluminum oxide, silicon carbide, silicon nitride, silicon oxide, or some other suitable dielectric. Further, the plurality of dielectric caps 128 may, for example, comprise silicon oxide, silicon oxycarbide, silicon carbide, silicon nitride, some Si—O—C—H dielectric, some other low-k dielectric, or the like. A dielectric constant of the dielectric caps 128 may, for example, be about 1 to 5 or some other suitable value.

Although item 120 is referred to as a plurality of wires, it will be appreciated that in some embodiments, item 120 may alternatively be or comprise any of a plurality of vias, a plurality of contacts, or a plurality of some other conductive features.

Further, although FIG. 1 illustrates the first interconnect structure 106a over the substrate 102 and below the plurality of wires 120, it will be appreciated that in some other embodiments, the integrated chip may not include the first interconnect structure 106a. For example, the plurality of wires 120 may be a plurality of contacts that may be directly connected to any of the one or more semiconductor devices 104.

Furthermore, although FIG. 1 illustrates the second interconnect structure 106b over the plurality of wires 120, it will be appreciated that in some other embodiments, the integrated chip may not include the second interconnect structure 106b.

Figure 3:
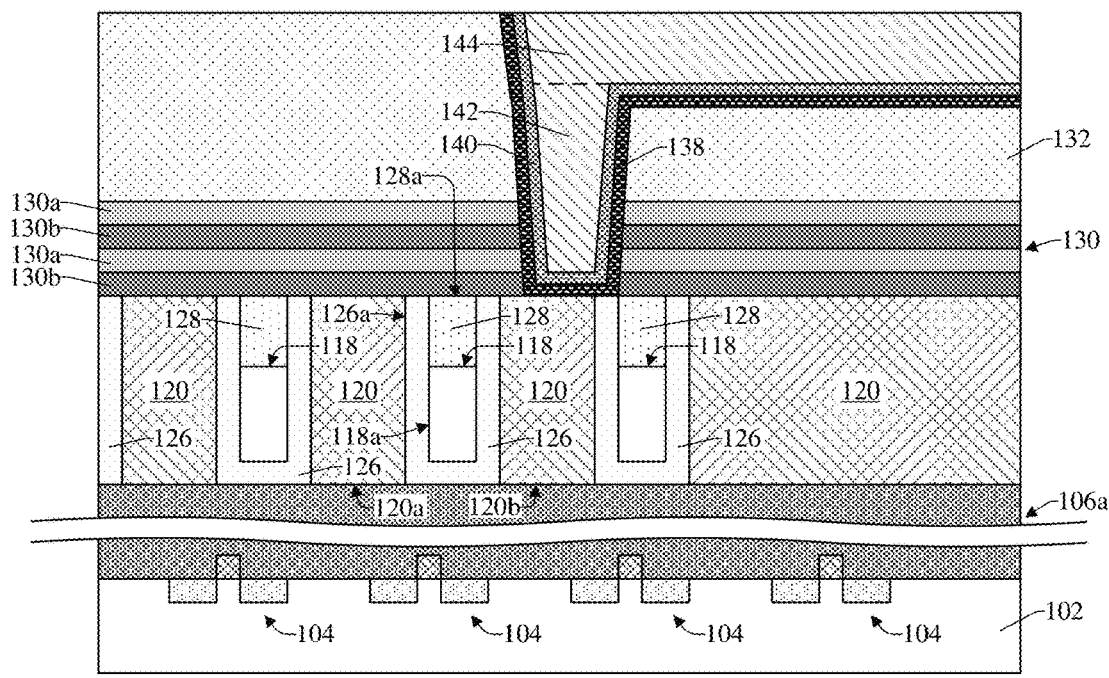
FIGS. 3 and 4 illustrate cross-sectional views of some alternative embodiments of the integrated chip of FIG. 1 in which a via is disposed over the second wire and a barrier layer is vertically between the second wire and the via.
Figure 4:
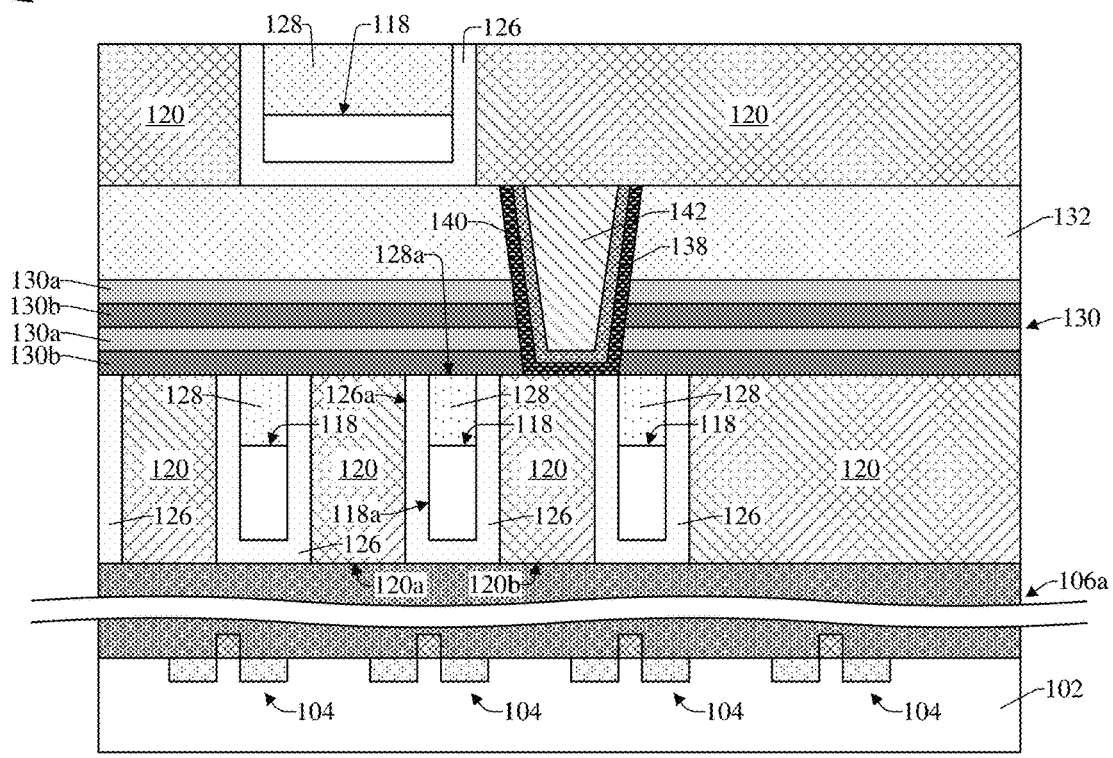

FIGS. 3 and 4 illustrate cross-sectional views 300 and 400 of some alternative embodiments of the integrated chip of FIG. 1 in which a via 142 is disposed over the second wire 120b and a barrier layer 138 is vertically between the second wire 120b and the via 142.

In such embodiments, an etch-stop layer 130 is over the plurality of wires 120, over the plurality of dielectric liners 126, and over the plurality of dielectric caps 128. The etch-stop layer 130 may, for example, comprise one or more materials (e.g., 130a, 130b) stacked in an alternating fashion. In addition, an intermetal dielectric (IMD) layer 132 is over the etch-stop layer 130.

The integrated chip further comprises a via 142. The via 142 extends through the IMD layer 132 and through the etch-stop layer 130 and may be electrically connected to any of the plurality of wires 120. For example, the via 142 is directly over the second wire 120b and is electrically connected to the second wire 120b.

In some embodiments, a liner layer 140 is on sidewalls and a lower surface of the via 142 and a barrier layer 138 is on sidewalls and a lower surface of the liner layer 140. The liner layer 140 surrounds the via 142 and the barrier layer 138 surrounds the liner layer 140. Thus, the liner layer 140 is also vertically between the second wire 120b and the via 142. The liner layer 140 may be in direct contact with the via 142 and the barrier layer 138. Further, the barrier layer 138 may be in direct contact with the liner layer 140 and the second wire 120b. The liner layer 140 may be used to reduce a potential for electromigration in the via 142. The barrier layer may be used to prevent metal diffusion from the via 142 into the surrounding IMD layer 132.

In some embodiments, the via 142 may, for example, comprise any of copper, nickel, cobalt, ruthenium, iridium, aluminum, platinum, palladium, gold, silver, osmium, tungsten, or some other suitable metal. Further, the via 142 is devoid of graphene.

The liner layer 140 may, for example, comprise tantalum, cobalt, ruthenium, or the like, and the barrier layer 138 may, for example, comprise tantalum nitride, some other metal-nitride, or the like.

Further, the etch-stop layer 130 may, for example, comprise titanium nitride, titanium oxide, aluminum nitride, aluminum oxide, silicon oxycarbide, silicon oxide, or the like.

Although item 142 is referred to as a via, it will be appreciated that in some embodiments, item 142 may alternatively be some other conductive feature.

In the embodiments illustrated in FIG. 3, a metal wire 144 is over the via 142 and may be electrically connected to the via 142. The metal wire 144 may comprise the same material(s) as the via 142. For example, the metal wire 144 is also devoid of graphene. Further, the liner layer 140 and the barrier layer 138 may extend along sidewalls and a lower surface of the metal wire 144.

In the embodiments of FIG. 4, a plurality of wires 120 are over the via 142 and may be electrically connected to the via 142. The plurality of wires 120 comprise graphene intercalated with one or more metals. Further, the plurality of wires 120 are laterally separated by one or more cavities 118, one or more dielectric liners 126, and one or more dielectric caps 128.

Figure 5:
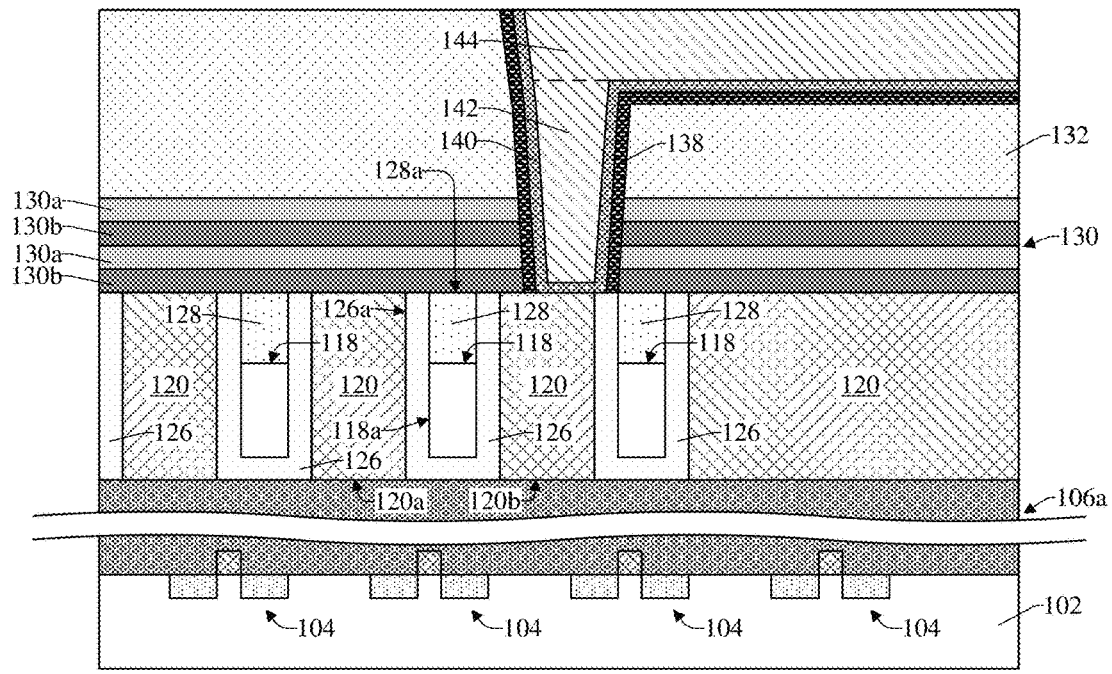
FIGS. 5 and 6 illustrate cross-sectional views of some alternative embodiments of the integrated chips of FIGS. 3 and 4, respectively, in which the barrier layer is not vertically between the second wire and the via.
Figure 6:
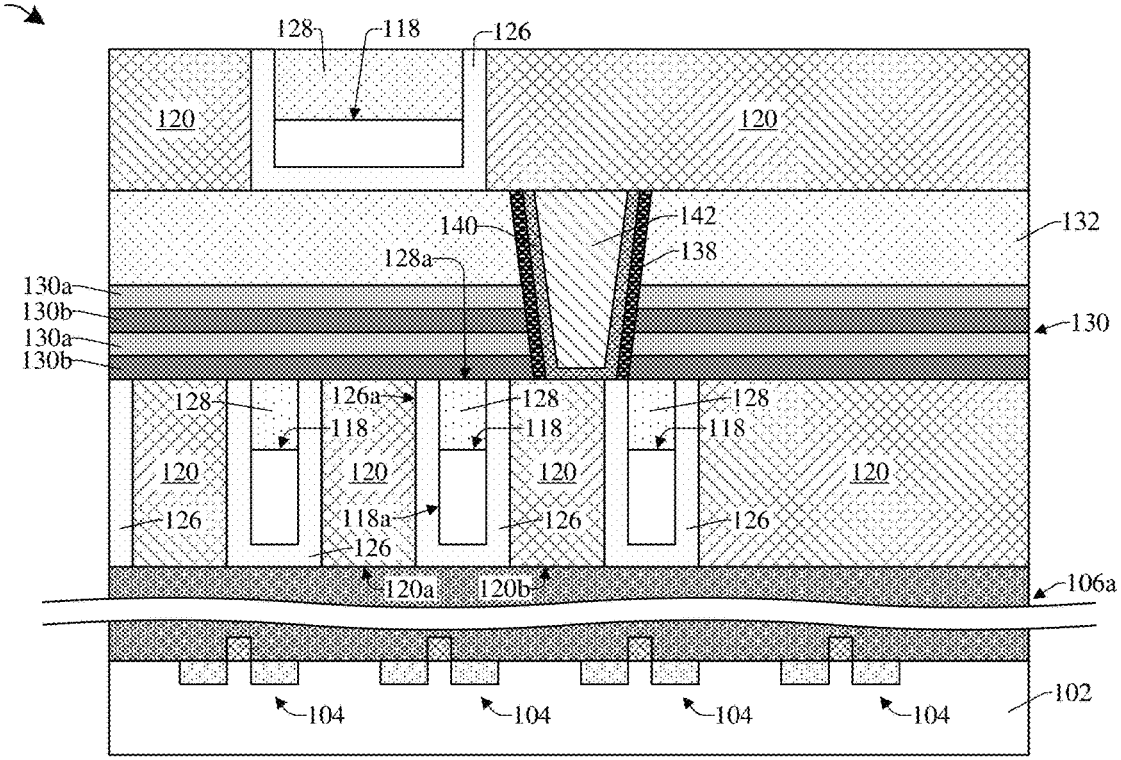

FIGS. 5 and 6 illustrate cross-sectional views 500 and 600 of some alternative embodiments of the integrated chips of FIGS. 3 and 4, respectively, in which the barrier layer 138 is not vertically between the second wire 120b and the via 142.

In such embodiments, the barrier layer 138 is on sidewalls of the liner layer 140 but not on a bottom surface of the liner layer 140. Further, the barrier layer 138 is not vertically between the liner layer 140 and the second wire 120b. Thus, the liner layer 140 may directly contact both the via 142 and the second wire 120b. In addition, the barrier layer 138 may directly contact both the liner layer 140 and the second wire 120b along a sidewall of the liner layer 140.

Figure 14:
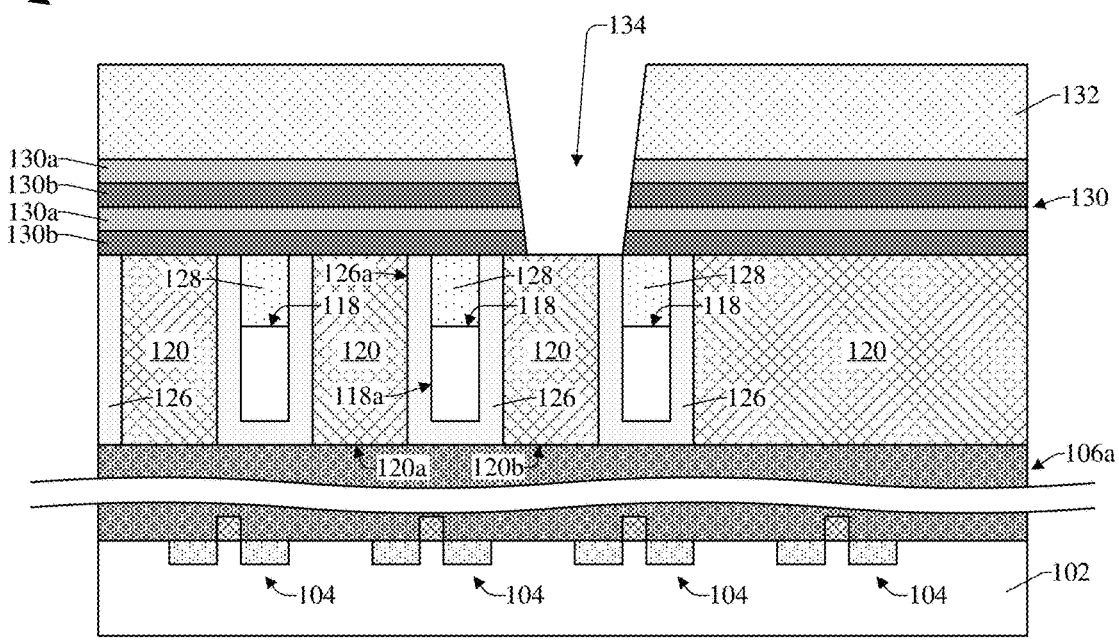
Figure 22:
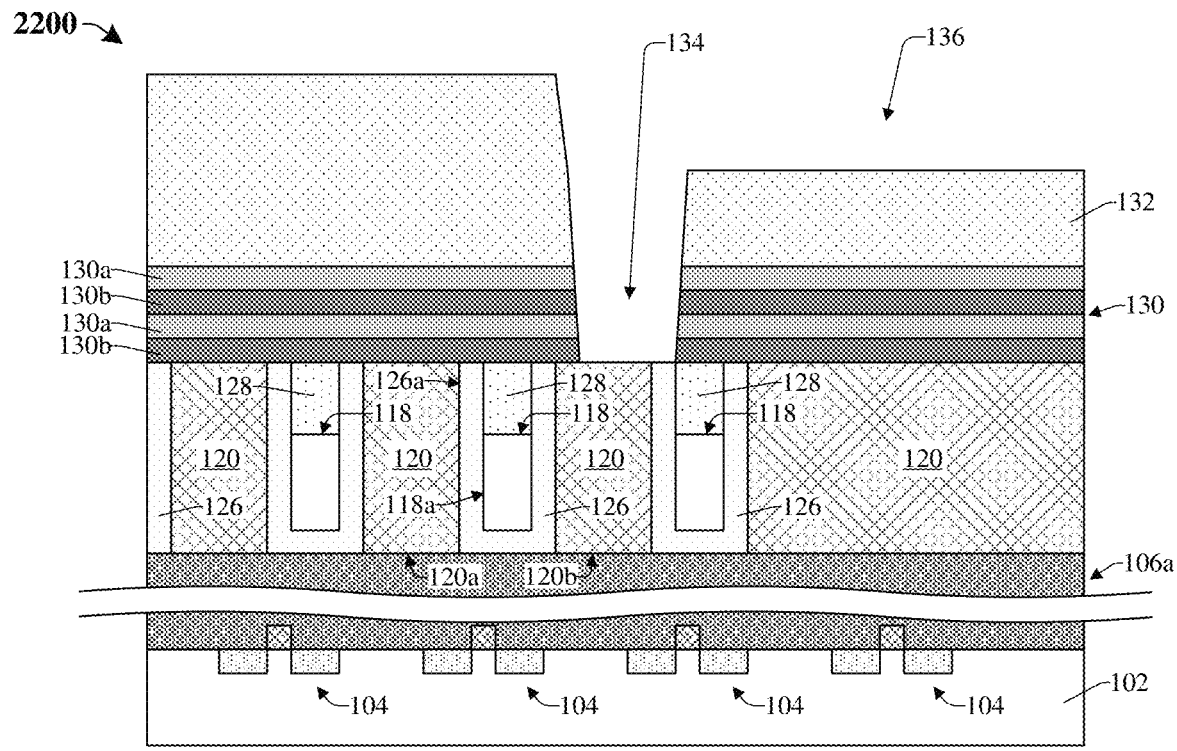

The barrier layer 138 may not be on a bottom surface of the liner layer 140 as a result of selectively forming the barrier layer 138 along sidewalls, but not a lower surface, of a via opening (see, for example, via opening 134 of FIGS. 14 and 22).

By including the barrier layer 138 along the sidewalls of the liner layer 140, a likelihood of the via 142 and/or the liner layer 140 diffusing into the surrounding IMD layer 132 is reduced. Further, by not including the barrier layer 138 vertically between a top of the second wire 120b and a bottom of the via 142, a contact resistance between the via 142 and the underlying second wire 120b may be reduced. As a result, a performance of the integrated chip may be enhanced.

FIGS. 7-23 illustrate cross-sectional views 700-2300 of some embodiments of a method for forming an integrated chip including a first wire 120a and a second wire 120b that comprise graphene. Although FIGS. 7-23 are described in relation to a method, it will be appreciated that the structures disclosed in FIGS. 7-23 are not limited to such a method, but instead may stand alone as structures independent of the method.

Figure 7:
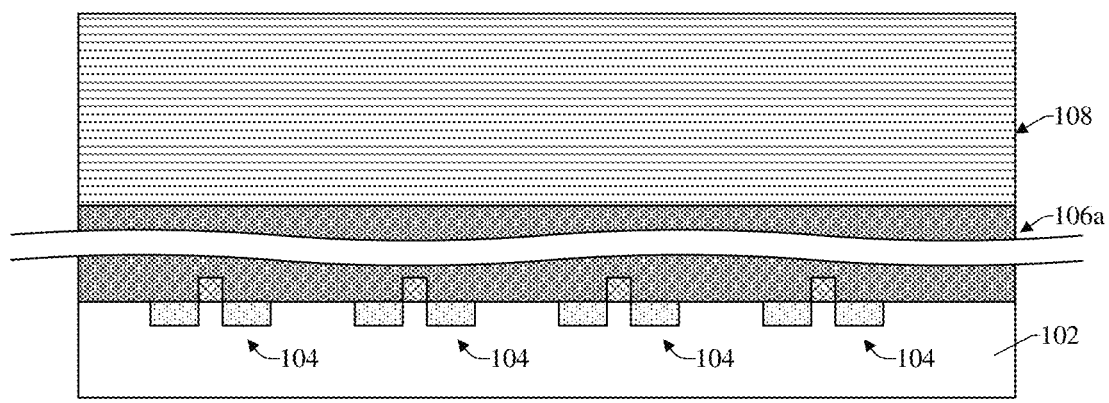
FIGS. 7-23 illustrate cross-sectional views of some embodiments of a method for forming an integrated chip including a first wire and a second wire that comprise graphene.

As shown in cross-sectional view 700 of FIG. 7, one or more semiconductor devices 104 are formed along an upper surface of a substrate 102. The one or more semiconductor devices 104 may be formed by a number of processes such as, for example, ion implantation, chemical vapor deposition (CVD), physical vapor deposition (PVD), atomic layer deposition (ALD), photolithography, wet etching, dry etching, or some other suitable processes.

In some embodiments, a first interconnect structure 106a may be formed over the substrate 102. The first interconnect structure 106a may, for example, be formed by depositing one or more dielectric layers, patterning the one or more dielectric layers, depositing one or more metals, planarizing the one or more metals, or some other suitable process.

In addition, a graphene stack 108 is formed over the substrate 102. The graphene stack 108 comprises a plurality of graphene sheets. The graphene stack 108 may, for example, be formed by depositing one or more graphene layers over the substrate 102 by a CVD process, an ALD process, a plasma enhanced CVD (PECVD) process, a plasma enhanced ALD (PEALD) process, or the like. A temperature during the deposition may, for example, be about 200 to 1200 degrees Celsius or some other suitable value.

In some embodiments (not shown), the graphene stack 108 may, for example, be deposited on a metal substrate (e.g., copper or the like) by a CVD process. The graphene stack 108 may then be removed from the metal substrate and may be transferred to the substrate 102. In some other embodiments (not shown), the graphene stack 108 may be deposited on a metal substrate by a CVD process and a support layer may be formed on an upper surface of the graphene stack 108. The metal substrate may then be removed from below the graphene stack 108 and the graphene stack 108 may be transferred to the substrate 102 with the support layer. The support layer may then be removed from over the graphene stack 108. In some other embodiments (not shown), a graphene precursor stack may be formed on the substrate 102. The graphene precursor stack and the substrate 102 may then undergo a heating process and/or a thermal CVD process within a furnace to form the graphene stack 108 on the substrate 102 from the graphene precursor stack.

Figure 8:
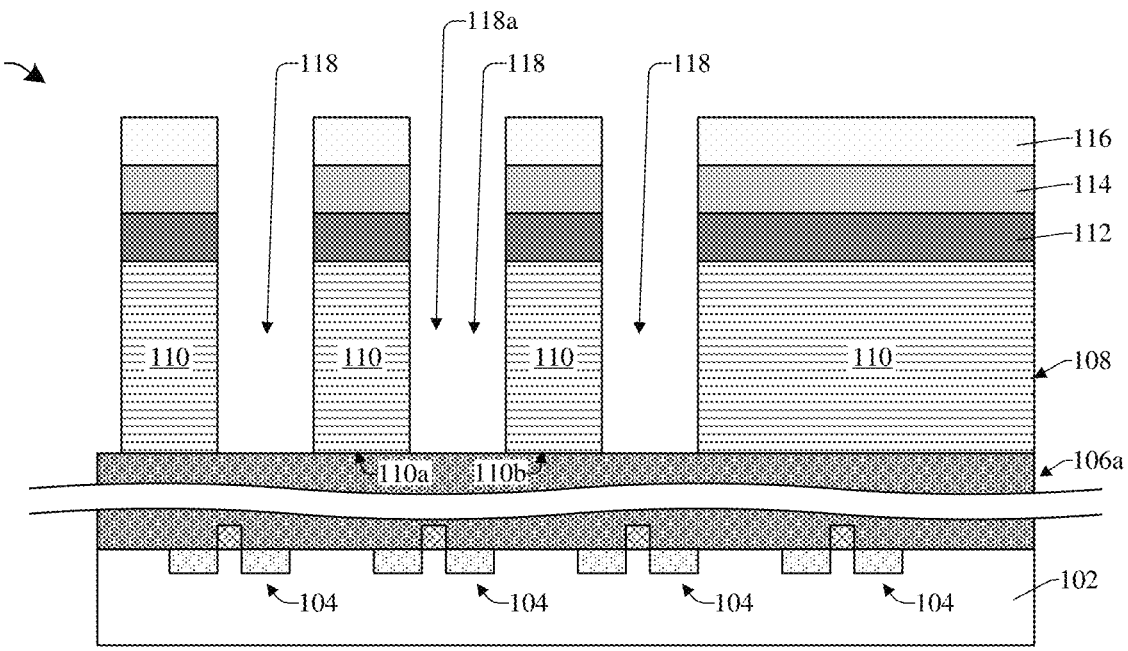

As shown in cross-sectional view 800 of FIG. 8, a first hard mask 112 is formed over the graphene stack 108, a second hard mask 114 is formed over the first hard mask 112, and a photoresist mask 116 is formed over the second hard mask 114. The graphene stack 108 is then patterned with any of the first hard mask 112, the second hard mask 114, and the photoresist mask 116 in place. The patterning defines a plurality of stack segments 110 that are laterally separated by a plurality of cavities 118. For example, the patterning defines a first stack segment 110a and a second stack segment 110b that are laterally separated by a first cavity 118a.

The first hard mask 112 may, for example, comprise titanium nitride or some other suitable material. Further, the second hard mask 114 may, for example, comprise silicon oxide, silicon oxycarbide, or some other suitable material.

Figure 9:
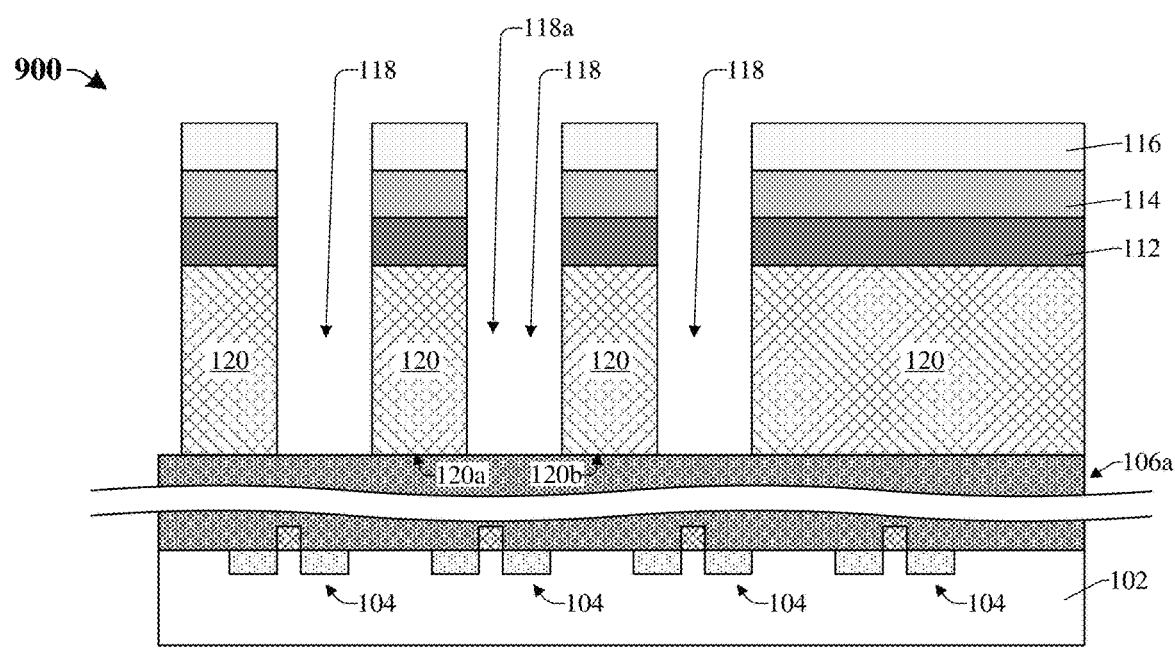

As shown in cross-sectional view 900 of FIG. 9, the plurality of graphene sheets of the plurality of stack segments 110 are intercalated with any of iron, cobalt, nickel, silver, gold, molybdenum, copper, or some other suitable metal to form a plurality of wires 120 from the plurality of stack segments 110. The intercalation process may, for example, comprise a thermal CVD process, a PECVD process, an electrochemical deposition process, or some other suitable process. In some embodiments, the photoresist mask 116 may be removed after the intercalation process.

For example, in some embodiments, the intercalation process may comprise heating one or more suitable metals in a furnace with the stack segments 110 until the metal(s) evaporates. The vapor from the evaporated metal(s) may then diffuse into and/or through the stack segments 110 and may be deposited between the plurality of graphene sheets of the plurality of stack segments 110 during diffusion. Other methods of intercalating the plurality of stack segments 110 with one or more suitable methods are also feasible.

For example, the plurality of graphene sheets of the first stack segment 110a and the second stack segment 110b are intercalated with one or more metals to form a first wire 120a and a second wire 120b, respectively.

Figure 10:
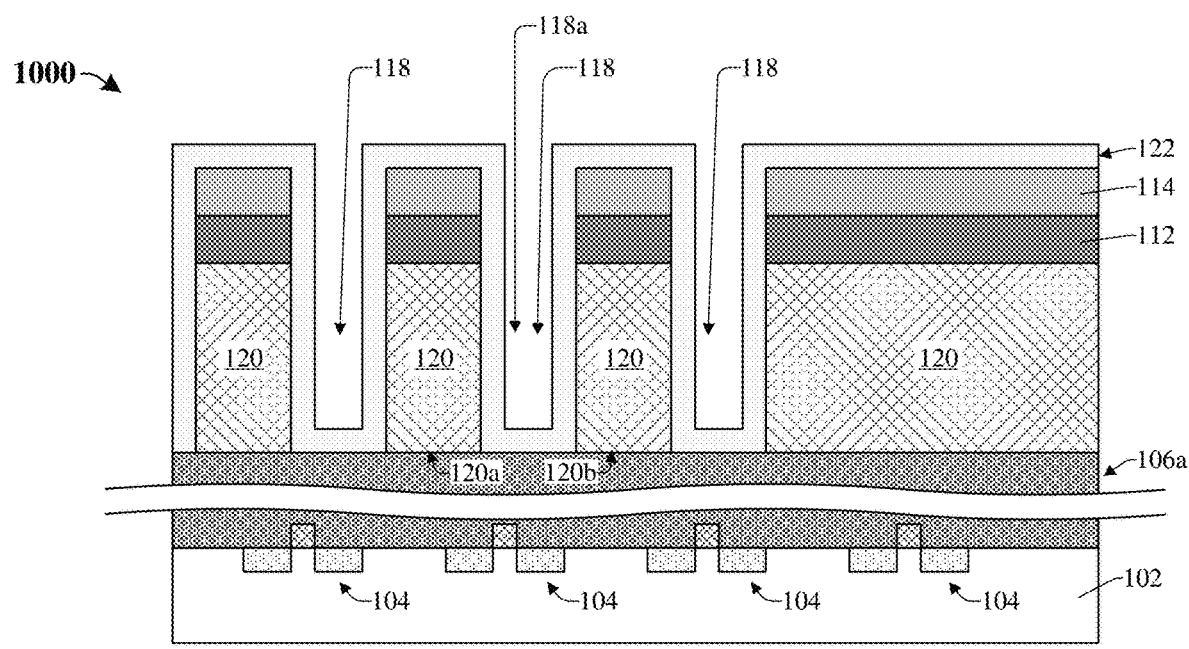

As shown in cross-sectional view 1000 of FIG. 10, a first dielectric layer 122 is conformally formed over tops of the second hard mask 114, on sidewalls of the second hard mask 114, on sidewalls of the first hard mask 112, on sidewalls of the plurality of wires 120, and on an upper surface of the first interconnect structure 106a. The first dielectric layer 122 partially fills the plurality of cavities 118. Thus, sidewalls and upper surfaces of the first dielectric layer 122 define the plurality of cavities 118. The first dielectric layer 122 is formed by depositing any of silicon oxycarbide, aluminum nitride, aluminum oxide, silicon carbide, silicon nitride, silicon oxide, or some other suitable dielectric over the substrate 102 by a CVD process, an ALD process, a PECVD process, a PEALD process, or some other suitable process.

For example, the first dielectric layer 122 is formed on opposing sidewalls of the first and second wires 120a, 120b, and extends between the opposing sidewalls along a top of the first interconnect structure 106a. Thus, sidewalls and an upper surface of the first dielectric layer 122 define the first cavity 118a.

Figure 11:
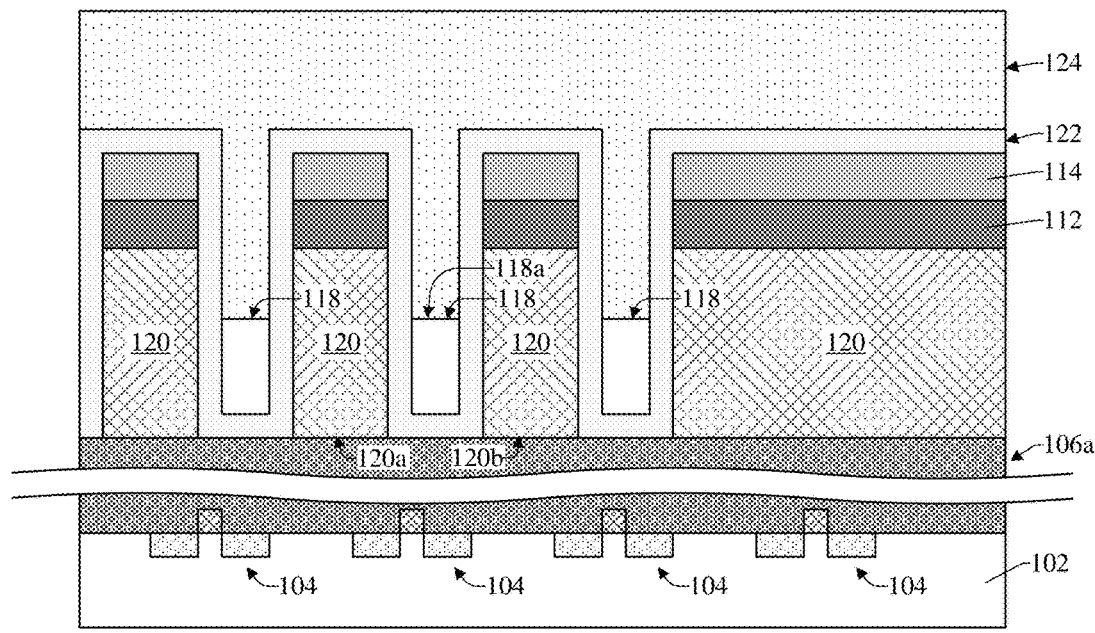

As shown in cross-sectional view 1100 of FIG. 11, a second dielectric layer 124 is formed over the first dielectric layer 122 and between sidewalls of the first dielectric layer 122. The second dielectric layer 124 partially fills and seals the plurality of cavities 118. Thus, lower surfaces of the second dielectric layer 124 further define the plurality of cavities 118. For example, the second dielectric layer 124 defines a top of the first cavity 118a. The second dielectric layer 124 is formed by depositing any of silicon oxide, silicon oxycarbide, silicon carbide, silicon nitride, some Si—O—C—H dielectric, some other low-k dielectric, or the like over the substrate 102 by a CVD process, an ALD process, or some other suitable process. A temperature during the deposition may, for example, be less than about 425 degrees Celsius or some other suitable value.

The second dielectric layer 124 may only partially fill the plurality of cavities 118 due to the fill capabilities of the material(s) included in the second dielectric layer 124 and/or due to the conformity of the deposition of the second dielectric layer 124. As a result, the plurality of cavities 118 remain beneath the second dielectric layer 124 and between the plurality of wires 120 after the second dielectric layer 124 is deposited.

Figure 12:
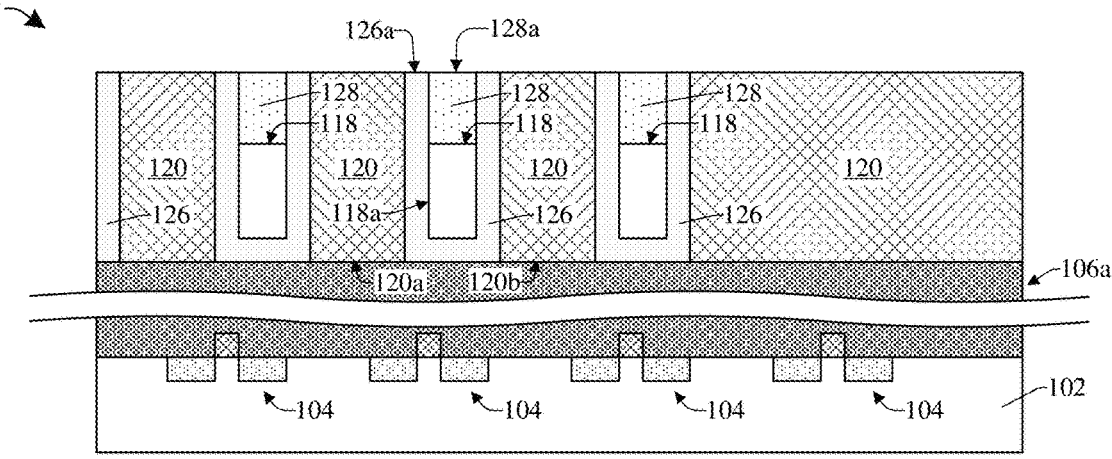

As shown in cross-sectional view 1200 of FIG. 12, a planarization process is performed into the second dielectric layer 124. The planarization process removes the second dielectric layer 124, the first dielectric layer 122, the second hard mask 114, and the first hard mask 112 from over the plurality of wires 120. Further, the planarization process defines a plurality of dielectric liners 126 and a plurality of dielectric caps 128 from the first dielectric layer 122 and the second dielectric layer, respectively. As a result of the planarization process, tops of the plurality of dielectric caps 128, the plurality of dielectric liners 126, and the plurality of wires 120 are approximately coplanar. The planarization process may, for example, comprise a chemical mechanical planarization (CMP) process or some other suitable planarization process.

Figure 13:
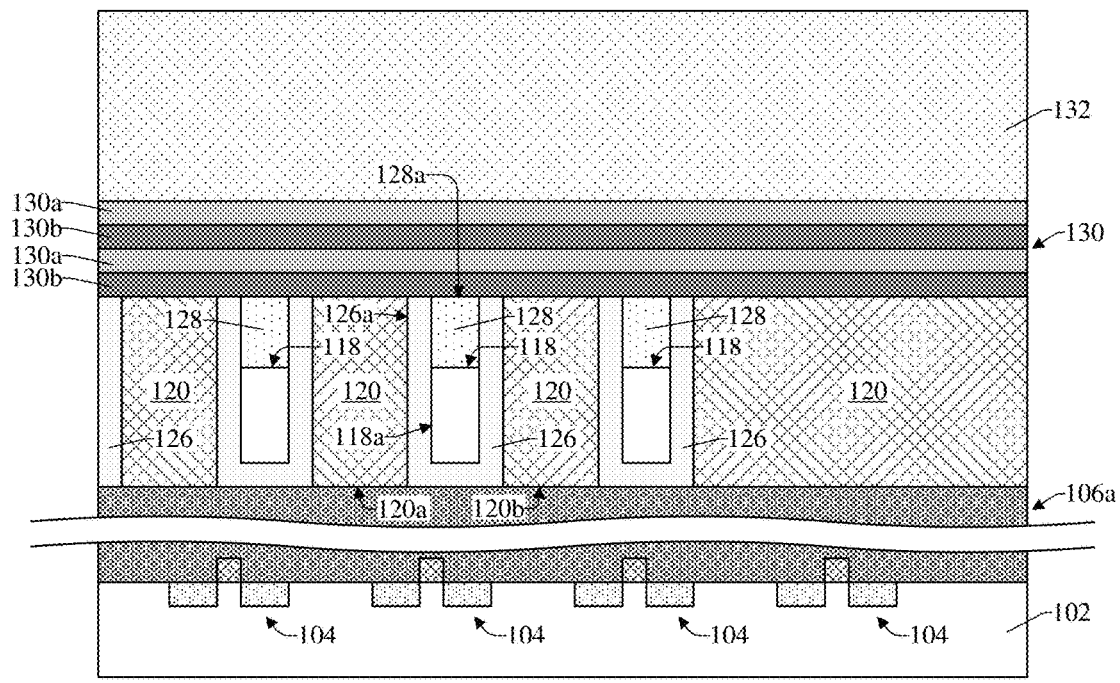

As shown in cross-sectional view 1300 of FIG. 13, an etch-stop layer 130 is formed over the plurality of wires 120, the plurality of dielectric liners 126, and the plurality of dielectric caps 128. The etch-stop layer 130 may, for example, comprise one or more layers (e.g., 130a, 130b) that may be stacked in an alternating fashion. The etch-stop layer 130 is formed by depositing any of titanium nitride, titanium oxide, aluminum nitride, aluminum oxide, silicon oxycarbide, silicon oxide, or the like over the substrate 102 by a CVD process, a PVD process, an ALD process, a PEALD process, a PECVD process, or the like. A temperature during the deposition may, for example, be less than about 425 degrees Celsius or some other suitable value.

In addition, an intermetal dielectric (IMD) layer 132 is formed over the etch-stop layer 130. The IMD layer 132 may, for example, be formed by depositing a dielectric over the substrate by a CVD process, an ALD process, or some other suitable process.

Figure 23:
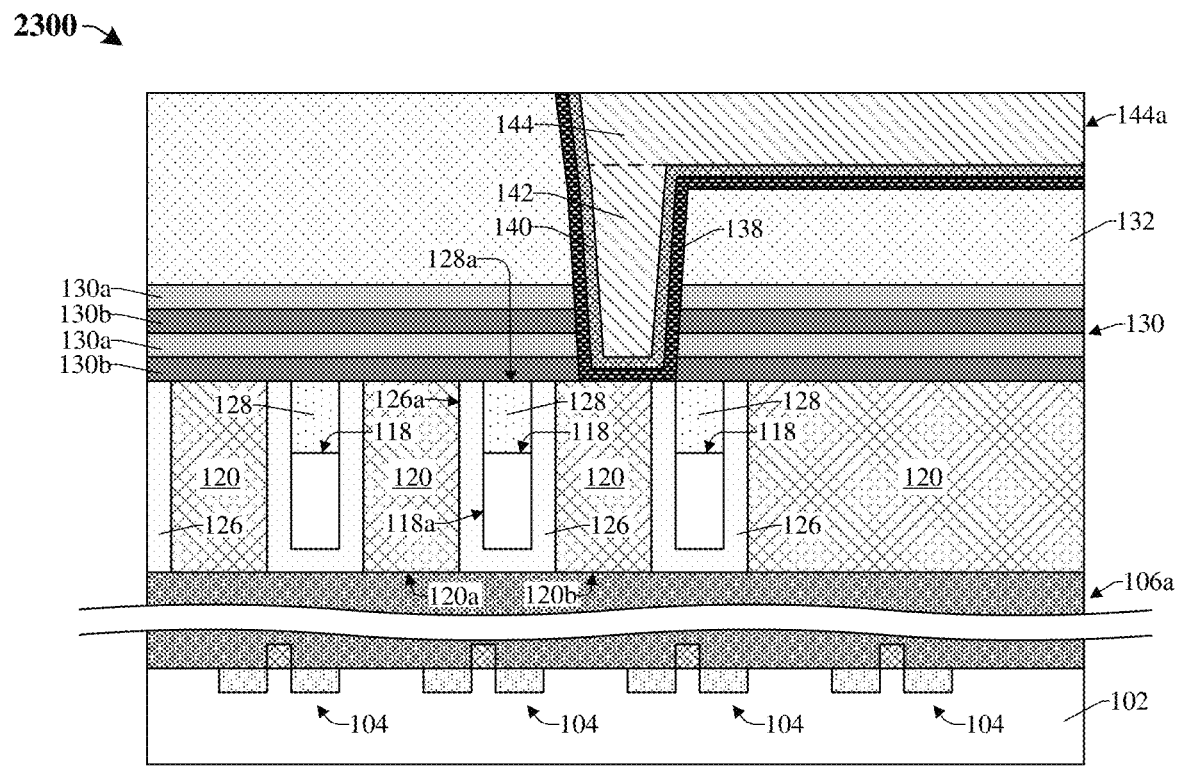

FIGS. 14-21 illustrate cross-sectional views 1400-2100 of a first embodiment for performing a remainder of the method, while FIGS. 22 and 23 illustrate cross-sectional views 2200 and 2300 of a second embodiment for performing the remainder of the method.

As shown in cross-sectional view 1400 of FIG. 14, the IMD layer 132 and the etch-stop layer 130 are patterned to form a via opening 134. In some embodiments, the via opening 134 may be misaligned with the underlying second wire 120b due to a misalignment in the patterning.

Figure 15:
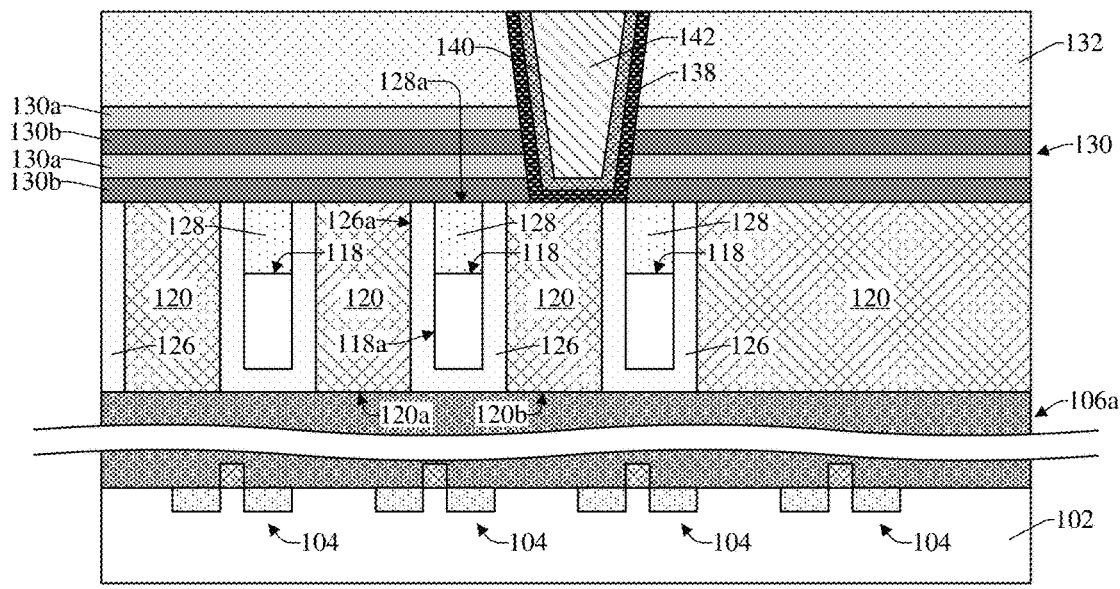
Figure 16:
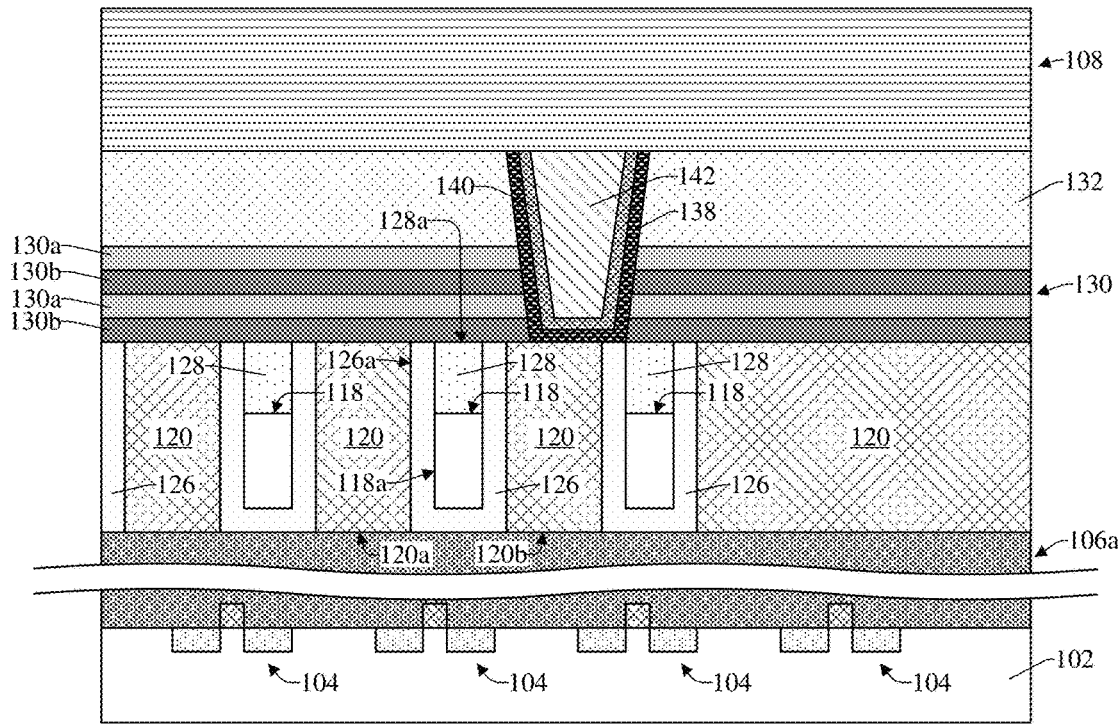
Figure 17:
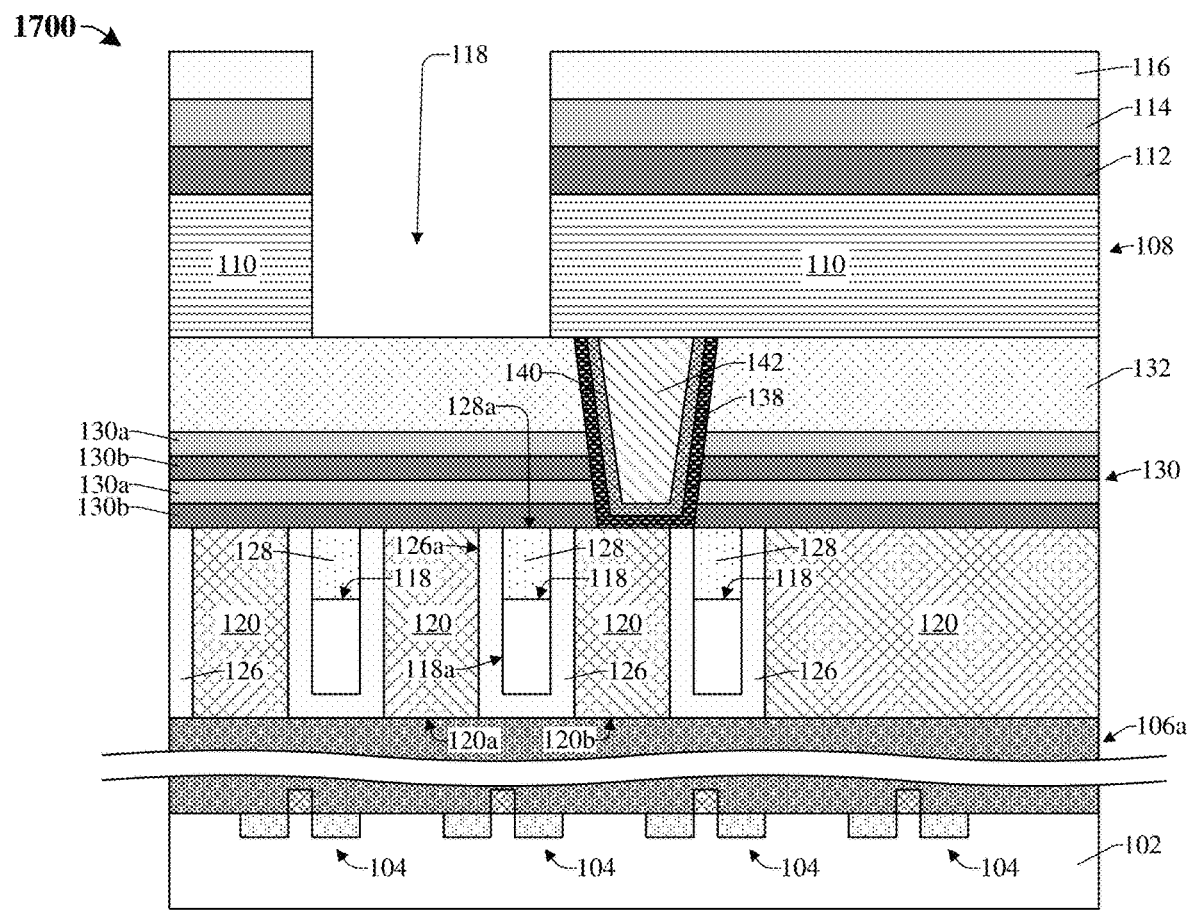
Figure 18:
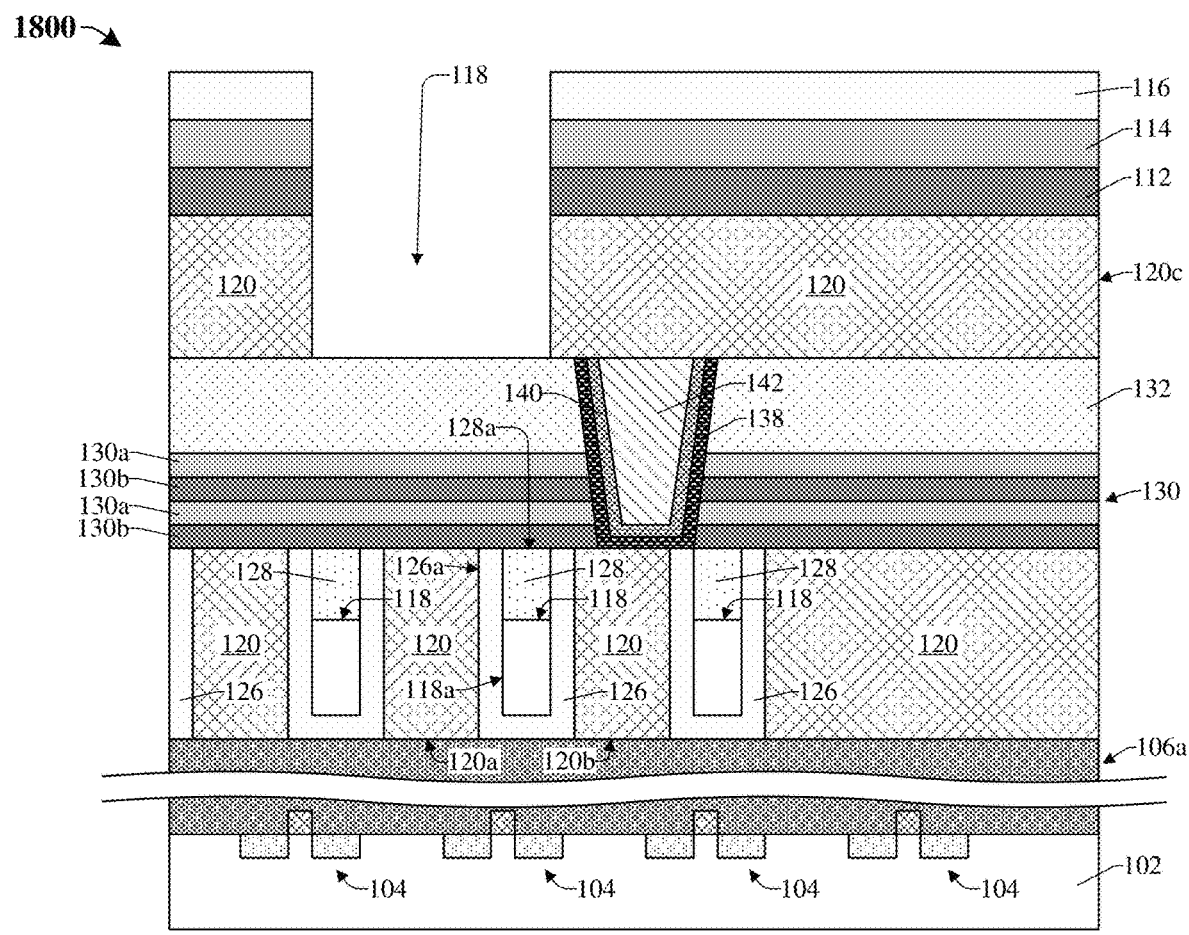
Figure 19:
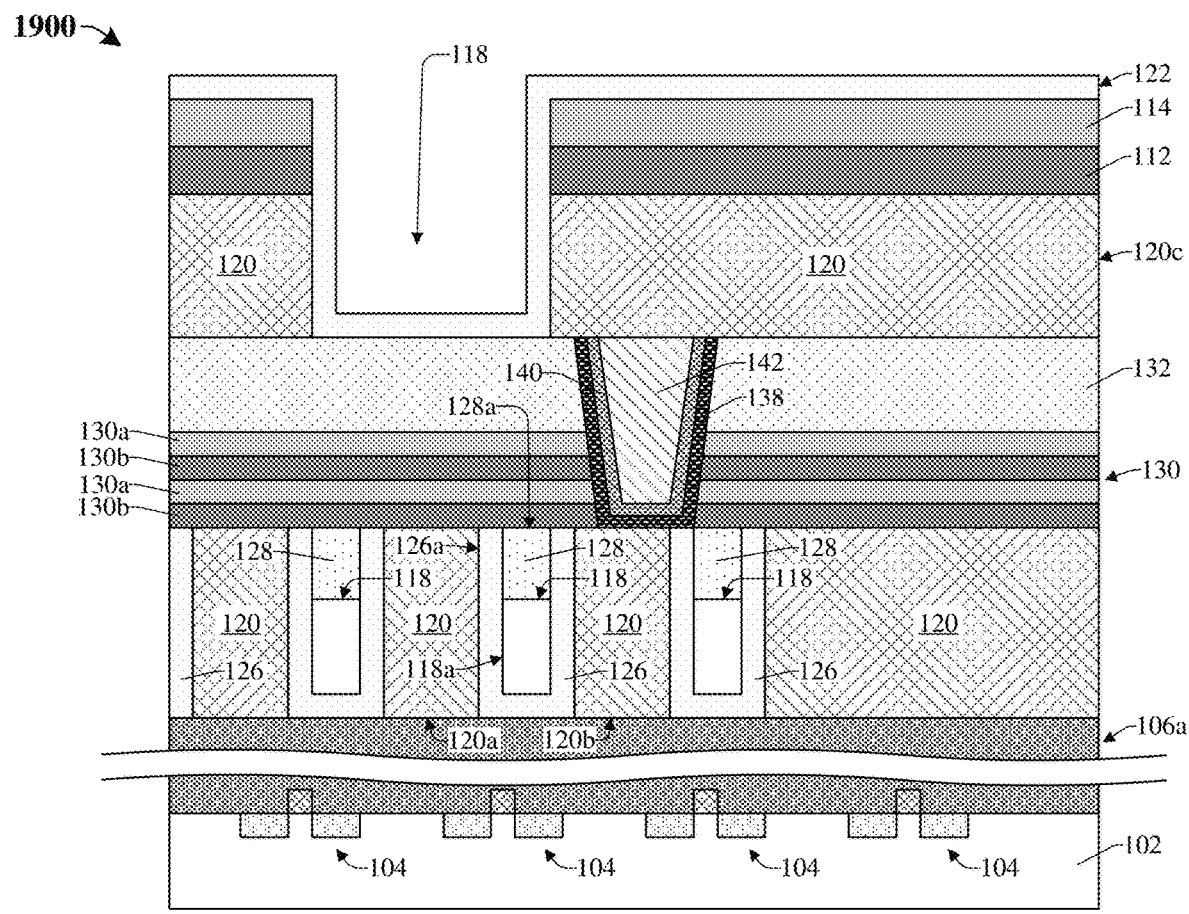
Figure 20:
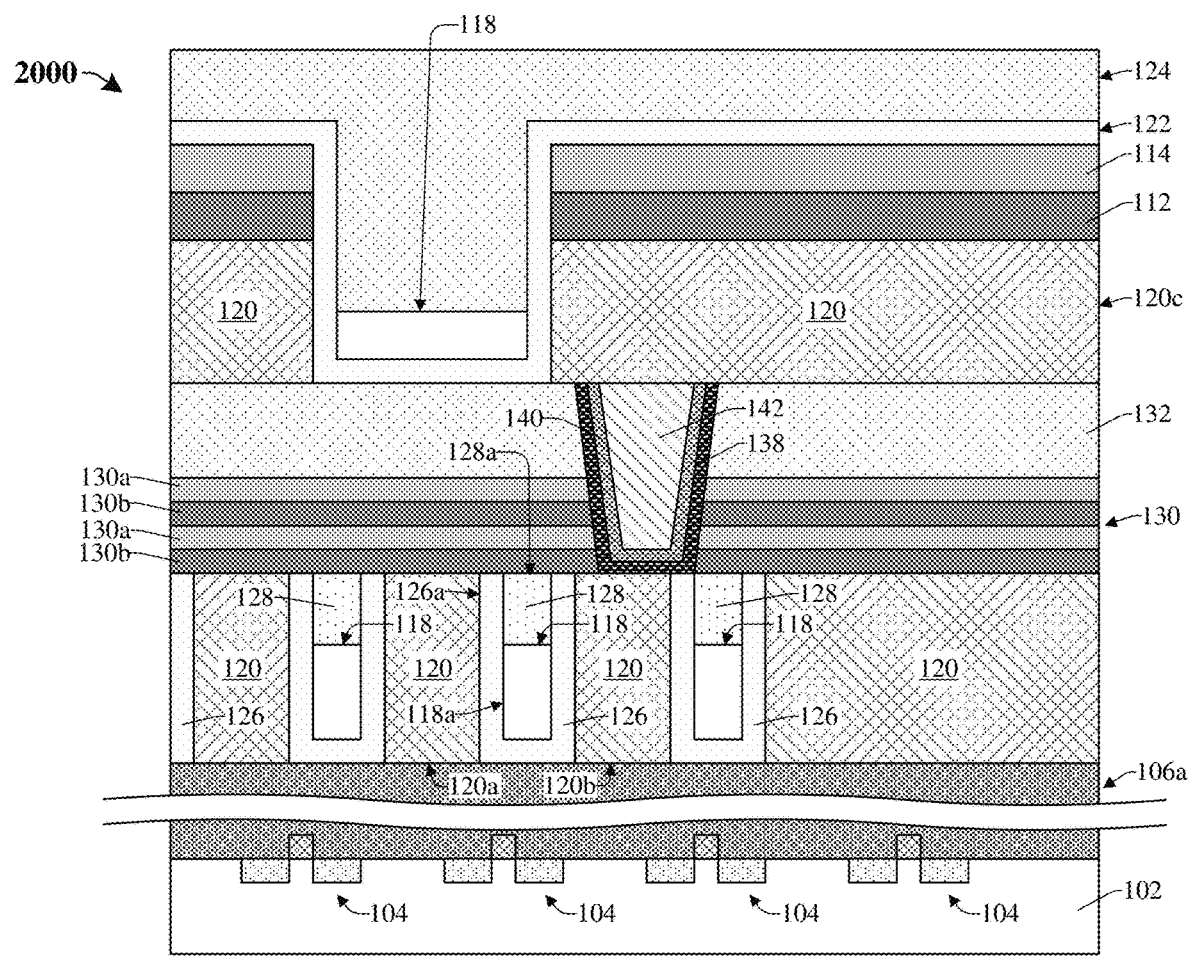
Figure 21:
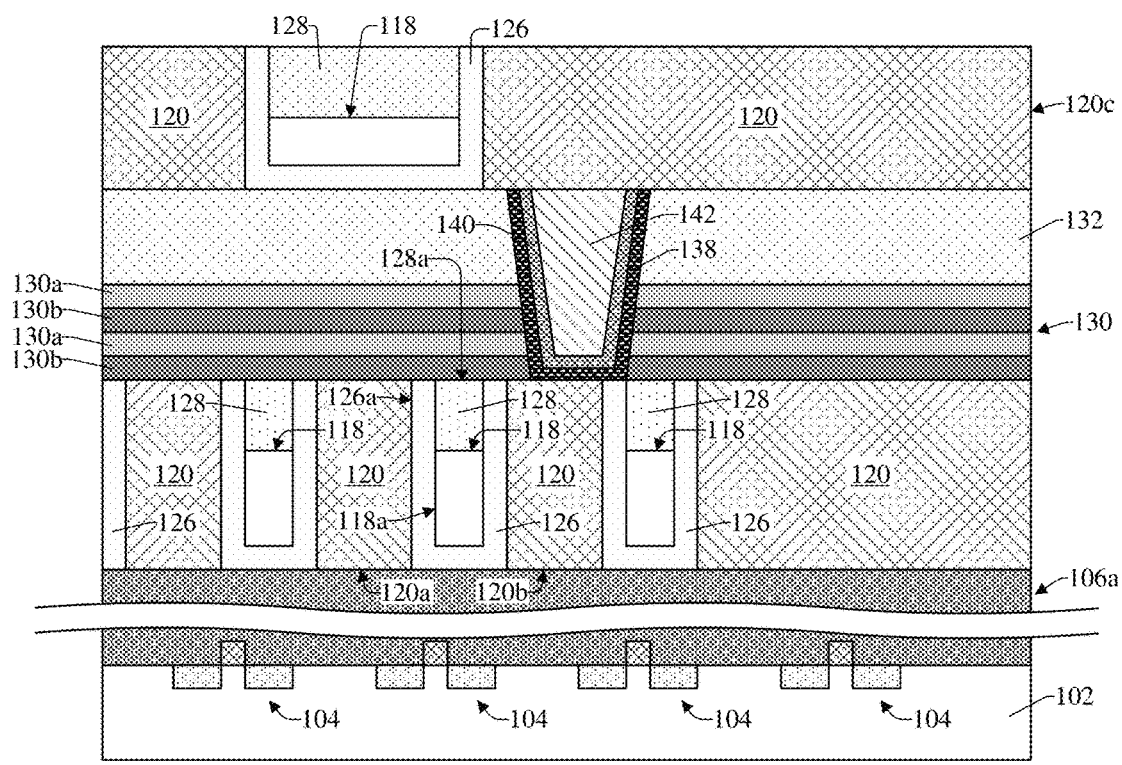

As shown in cross-sectional view 1500 of FIG. 15, a barrier layer 138 is conformally formed on sidewalls of the IMD layer 132 and sidewalls of the etch-stop layer 130. The barrier layer 138 may be formed on a top surface of the first wire 120a. In some embodiments, the barrier layer 138 may also be formed on a top surface of any of the plurality of dielectric liners 126 and/or any of the plurality of dielectrics caps 128 due to the misalignment of the via opening 134. The barrier layer 138 may, for example, be formed by a CVD process, an ALD process, PVD process, a PECVD process, a PEALD process, or some other suitable process.

In some other embodiments (see, for example, FIG. 6), the barrier layer 138 is selectively formed along the sidewalls of the IMD layer 132 and along sidewalls of the etch-stop layer 130 that define the via opening 134, but is not formed along an upper surface of the second wire 120b that further defines the via opening 134. The barrier layer 138 may, for example, be selectively formed by forming a blocking layer along the bottom of the via opening 134 which may block the barrier layer 138 from being deposited along the bottom of the via opening 134. Alternatively, the barrier layer 138 may, for example, be selectively formed by using a selective ALD process and/or a selective CVD process.

Further, a liner layer 140 is conformally formed on sidewalls and an upper surface of the barrier layer 138. The liner layer 140 may, for example, be formed by a CVD process, an ALD process, PVD process, a PECVD process, a PEALD process, or some other suitable process.

Furthermore, a metal is deposited between sidewalls of the liner layer 140 and over an upper surface of the liner layer to form a via 142. The via 142 may, for example, be formed by depositing any of copper, nickel, cobalt, ruthenium, iridium, aluminum, platinum, palladium, gold, silver, osmium, tungsten, or some other suitable metal over the substrate 102 by a CVD process, a PVD process, an ALD process, an electroless deposition (ELD) process, an electrochemical plating (ECP) process, or the like. A temperature during the metal deposition may, for example, be less than about 700 degrees Celsius or some other suitable value. In addition, a planarization process may be performed on the metal after the metal deposition.

FIGS. 16-21 illustrate cross-sectional views 1600-2100 of a method of forming a plurality of wires 120 over the via 142 that is similar to the method illustrated in cross-sectional views 700-1200 of FIGS. 7-12. For example, a graphene stack 108 is deposited over the via 142 (see, for example, FIG. 16); the graphene stack 108 is patterned to define a plurality of stack segments 110 that are separated by one or more cavities 118 (see, for example, FIG. 17); the plurality of stack segments 110 are intercalated with one or more metals to form a plurality of wires 120 from the plurality of stack segments 110 (see, for example, FIG. 18); a first dielectric layer 122 is conformally formed along sidewalls of the plurality of wires 120 (see, for example, FIG. 19); a second dielectric layer 124 is formed over and between the plurality of wires 120 (see, for example, FIG. 20); and a planarization process is performed on the second dielectric layer 124 to define one or more dielectric liners 126 and one or more dielectric caps 128 (see, for example, FIG. 21). For example, a third wire 120c is formed over the via 142 and comprises intercalated metal and graphene.

Alternatively, FIGS. 22 and 23 illustrate cross-sectional views 2200 and 2300 of the second embodiment for performing the remained of the method. As noted above, FIGS. 22-23 are alternatives to FIGS. 14-21 and may proceed from FIG. 13.

As shown in cross-sectional view 2200 of FIG. 22, the IMD layer 132 and the etch-stop layer 130 are patterned to form a via opening 134 and a trench opening 136. In some embodiments, the via opening 134 may be misaligned with the underlying second wire 120b due to a misalignment in the patterning.

As shown in cross-sectional view 2300 of FIG. 23, a barrier layer 138 is conformally formed on sidewalls of the IMD layer 132 and sidewalls of the etch-stop layer 130. The barrier layer may be formed on a top surface of the first wire 120a. In some embodiments, the barrier layer 138 may also be formed on a top surface of any of the plurality of dielectric liners 126 and/or any of the plurality of dielectrics caps 128. The barrier layer 138 may, for example, be formed by a CVD process, an ALD process, PVD process, a PECVD process, a PEALD process, or some other suitable process.

In some other embodiments (see, for example, FIG. 5), the barrier layer 138 is selectively formed along the sidewalls of the IMD layer 132 and along sidewalls of the etch-stop layer 130 that define the via opening 134, but is not formed along an upper surface of the second wire 120b that further defines the via opening 134.

Further, a liner layer 140 is conformally formed on sidewalls and one or more upper surfaces of the barrier layer 138. The liner layer 140 may, for example, be formed by a CVD process, an ALD process, PVD process, a PECVD process, a PEALD process, or some other suitable process.

Furthermore, a metal is deposited between sidewalls of the liner layer 140 and over one or more upper surfaces of the liner layer to form a via 142 and a metal wire 144. The via 142 and/or the metal wire 144 may, for example, be or comprise formed by depositing any of copper, nickel, cobalt, ruthenium, iridium, aluminum, platinum, palladium, gold, silver, osmium, tungsten, combinations and/or alloys of the foregoing, or other suitable materials. Further, the via 142 and/or the metal wire 144 may, for example, be deposited over the substrate 102 by a CVD process, a PVD process, an ALD process, an ELD process, an ECP process, or the like. A temperature during the metal deposition may, for example be less than about 700 degrees Celsius or some other suitable value. In addition, a planarization process may be performed on the metal after the metal deposition. For example, a first metal wire 144a is formed over the via 142. The first metal wire 144a may be electrically connected to the via 142 and may be devoid of graphene.

Figure 24:
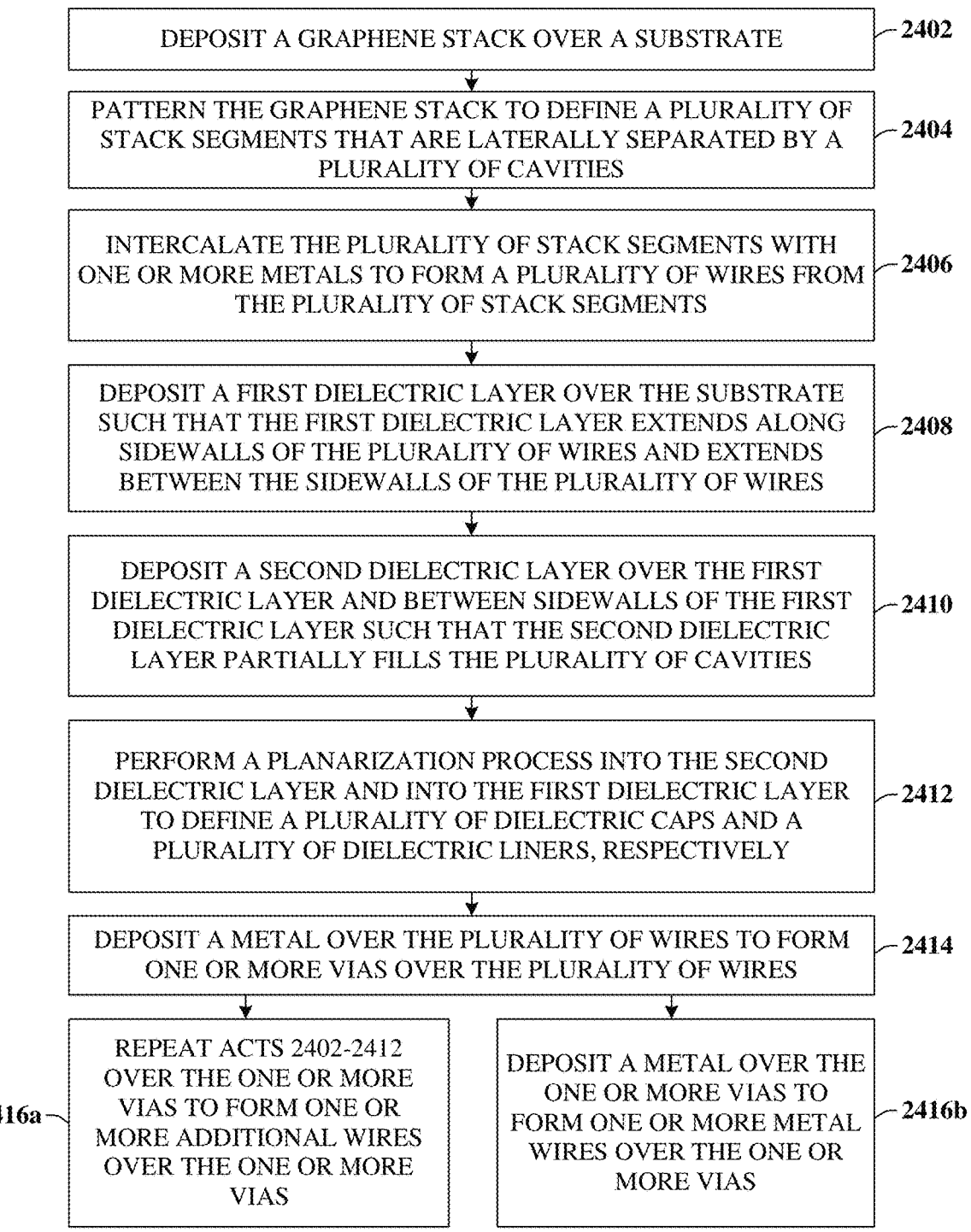
FIG. 24 illustrates a flow diagram of some embodiments of a method for forming an integrated chip including a first wire and a second wire that comprise graphene.

FIG. 24 illustrates a flow diagram of some embodiments of a method 2400 for forming an integrated chip including a first wire and a second wire that comprise graphene. While method 2400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2402, a graphene stack is deposited over a substrate. FIG. 7 illustrates a cross-sectional view 700 of some embodiments corresponding to act 2402.

At 2404, the graphene stack is patterned to define a plurality of stack segments that are laterally separated by a plurality of cavities. FIG. 8 illustrates a cross-sectional view 800 of some embodiments corresponding to act 2404.

At 2406, the plurality of stack segments are intercalated with one or more metals to form a plurality of wires from the plurality of stack segments. FIG. 9 illustrates a cross-sectional view 900 of some embodiments corresponding to act 2406.

At 2408, a first dielectric layer is deposited over the substrate such that the first dielectric layer extends along sidewalls of the plurality of wires and extends between the sidewalls of the plurality of wires. FIG. 10 illustrates a cross-sectional view 1000 of some embodiments corresponding to act 2408.

At 2410, a second dielectric layer is deposited over the first dielectric layer and between sidewalls of the first dielectric layer such that the second dielectric layer partially fills the plurality of cavities. FIG. 11 illustrates a cross-sectional view 1100 of some embodiments corresponding to act 2410.

At 2412, a planarization process is performed into the second dielectric layer and into the first dielectric layer to define a plurality of dielectric caps and a plurality of dielectric liners, respectively. FIG. 12 illustrates a cross-sectional view 1200 of some embodiments corresponding to act 2412.

At 2414, a metal is deposited over the plurality of wires to form one or more vias over the plurality of wires. FIGS. 13-15, 22, and 23 illustrate cross-sectional views 1300-1500, 2200, and 2300 of some embodiments corresponding to act 2414.

Act 2416a describes a first embodiment for performing a remainder of the method while act 2416b describes a second embodiment for performing the remainder of the method.

At 2416a, acts 2402-2412 are repeated over one or more vias to form one or more additional wires over the one or more vias. FIGS. 16-21 illustrate cross-sectional views 1600-2100 of some embodiments corresponding to act 2416a.

At 2416b, a metal is deposited over the one or more vias to form one or more metal wires over the one or more vias. FIG. 23 illustrates a cross-sectional view 2300 of some embodiments corresponding to act 2416b.

Thus, the present disclosure relates to an integrated chip including a first wire and a second wire that comprise graphene for improving a performance and reliability of the integrated chip.

Accordingly, in some embodiments, the present disclosure relates to an integrated chip. The integrated chip comprises a substrate. A first conductive feature is over the substrate. A second conductive feature is over the substrate and is laterally adjacent to the first conductive feature. The first and second conductive features are separated by a cavity. The first conductive feature and the second conductive feature comprise graphene and one or more metals.

In other embodiments, the present disclosure relates to an integrated chip comprising a substrate. A first wire is over the substrate. A second wire is over the substrate and is separated from the first wire by a dielectric liner, a dielectric cap, and a cavity. The dielectric liner is on opposing sidewalls of the first and second wires that are on opposite sides of the cavity. The dielectric liner extends laterally between the opposing sidewalls of the first and second wires. The cavity overlies the dielectric liner and the cavity is between the opposing sidewalls of the first and second wires. The dielectric cap overlies the cavity and extends laterally between opposing sidewalls of the dielectric liner that are on the opposite sides of the cavity. A via is over the first and second wires and is electrically connected to the second wire. The first and second wires comprise a graphene stack that is intercalated with one or more metals. The via comprises metal and is devoid of graphene.

In yet other embodiments, the present disclosure relates to a method for forming an integrated chip. The method comprises depositing a stack comprising a plurality of graphene layers. The stack is patterned to form a first stack segment and a second stack segment that are laterally separated by a cavity. The plurality of graphene layers are intercalated with one or more metals to form a first wire and a second wire from the first stack segment and the second stack segment, respectively. A dielectric layer is deposited covering the first wire, the second wire, and the cavity. A portion of the cavity remains unfilled after depositing the dielectric layer. The dielectric layer is removed from over the first and second wires to define a dielectric cap that seals the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    forming a metal interconnect within a first dielectric layer over a substrate;
    depositing a stack comprising a plurality of graphene layers over the substrate, wherein a first graphene layer of the plurality of graphene layers is deposited directly on the metal interconnect and the first dielectric layer;
    patterning the stack to form a first stack segment and a second stack segment that are laterally separated by a cavity;
    intercalating the plurality of graphene layers with one or more metals to form a first wire and a second wire from the first stack segment and the second stack segment, respectively;
    depositing a second dielectric layer covering the first wire, the second wire, and the cavity, wherein a portion of the cavity remains unfilled after depositing the second dielectric layer; and removing the second dielectric layer from over the first and second wires to define a dielectric cap that seals the cavity.

2. The method of claim 1, further comprising:
depositing a third dielectric layer lining and partially filling the cavity and further covering the first and second wires, wherein the second dielectric layer is deposited covering the third dielectric layer, wherein the third dielectric layer is on sidewalls of the plurality of graphene layers intercalated with the one or more metals, and wherein sidewalls and an upper surface of the third dielectric layer partially delimit the cavity.

3. The method of claim 2, wherein removing the second dielectric layer from over the first and second wires comprises a planarization process, and wherein the planarization process removes the second dielectric layer and the third dielectric layer from top surfaces of the first and second wires.

4. The method of claim 1, further comprising:
depositing a metal over the second wire to form a metal via over the second wire, wherein the metal via has a higher resistivity than the second wire.

5. The method of claim 4, further comprising:
depositing a separate graphene stack directly on the metal of the metal via; and
intercalating the separate graphene stack with one or more metals to form a third wire comprising the separate graphene stack intercalated with the one or more metals directly on the metal of the metal via.

6. The method of claim 4, further comprising:
depositing a barrier layer directly on the intercalated graphene and one or more metals of the second wire; and
depositing a liner layer on the barrier layer, wherein the metal is deposited over the liner layer to form the metal via over the liner layer and the second wire, and wherein the barrier layer and the liner layer are directly between the intercalated graphene and one or more metals of the second wire and metal of the metal via.

7. The method of claim 1, wherein intercalating the plurality of graphene layers with the one or more metals comprises depositing the one or more metals between graphene layers of the plurality of graphene layers.

8. The method of claim 1, wherein patterning the stack comprises etching the plurality of graphene layers according to a hard mask, and wherein the hard mask is over the first stack segment and the second stack segment during the intercalating the plurality of graphene layers with the one or more metals.

9. A method for forming an integrated chip, the method comprising:
depositing a plurality of graphene layers directly on a metal interconnect and a first dielectric layer that overlie a substrate;
etching the plurality of graphene layers to form a first graphene stack from the plurality of graphene layers, a second graphene stack from the plurality of graphene layers, and a cavity laterally between the first graphene stack and the second graphene stack;
intercalating a metal between graphene layers of the first graphene stack to form a first wire from the first graphene stack and the metal, and intercalating the metal between graphene layers of the second graphene stack to form a second wire from the second graphene stack and the metal, wherein the intercalated metal and graphene of the first wire is directly on the metal interconnect and the first dielectric layer;
depositing a second dielectric layer over the first wire, the second wire, and the cavity, wherein the second dielectric layer seals the cavity; and
planarizing the second dielectric layer to form a dielectric cap from the second dielectric layer and to uncover top surfaces of the first wire and the second wire, the dielectric cap disposed between the first wire and the second wire and over the cavity.

10. The method of claim 9, wherein intercalating the metal between the graphene layers of the first graphene stack comprises diffusing the metal through the graphene layers of the first graphene stack to deposit the metal between graphene layers of the first graphene stack.

11. The method of claim 9, further comprising:
forming a metal via directly over the second wire, wherein the metal via is devoid of graphene and between sidewalls of a third dielectric layer.

12. The method of claim 11, further comprising:
forming a metal liner layer over the second wire before forming the metal via over the second wire, wherein the metal liner layer lines sidewalls and a bottom surface of the metal via; and
forming a barrier layer over the second wire before forming the metal liner layer over the second wire, wherein the barrier layer lines sidewalls of the metal liner layer.

13. The method of claim 11, further comprising:
depositing a separate plurality of graphene layers directly on the metal via and the third dielectric layer;
etching the separate plurality of graphene layers to form a third graphene stack from the separate plurality of graphene layers, the third graphene stack directly on the metal via; and
intercalating a separate metal between graphene layers of the third graphene stack to form a third wire from the third graphene stack and the separate metal, wherein the intercalated metal and graphene of the third wire is directly on a top surface of the metal via.

14. The method of claim 11, further comprising:
forming a metal wire directly over and coupled to the metal via, wherein the metal wire is devoid of graphene.

15. The method of claim 9, further comprising:
depositing a dielectric liner layer over the first wire, over the second wire, and in the cavity on sidewalls of the first wire and the second wire before depositing the second dielectric layer over the first wire, the second wire, and the cavity, wherein the second dielectric layer is deposited on a top surface and sidewalls of the dielectric liner layer, and wherein the sidewalls and an upper surface of the dielectric liner layer partially delimit the cavity.

16. A method for forming an integrated chip, the method comprising:
forming a semiconductor device along a substrate;
forming a first wire over and coupled to the semiconductor device, the first wire comprising a first metal and a first stack of graphene sheets, wherein the first metal is intercalated between sheets of the first stack of graphene sheets;
forming a metal via within a first dielectric layer over the first wire, the metal via coupled to the first wire;
depositing a second stack of graphene sheets directly on an upper surface of the metal via and an upper surface of the first dielectric layer;

patterning the second stack of graphene sheets to form a cavity between a first segment of the second stack of graphene sheets and a second segment of the second stack of graphene sheets;

depositing a second metal between graphene sheets of the first segment of the second stack of graphene sheets and between graphene sheets of the second segment of the second stack of graphene sheets to form a second wire from the first segment of the second stack of graphene sheets and the second metal and a third wire from the second segment of the second stack of graphene sheets and the second metal;

depositing a second dielectric layer over the second wire, the third wire, and the cavity, wherein the cavity is delimited by a lower surface of the second dielectric layer; and removing the second dielectric layer from over the second wire and the third wire to uncover the second wire and the third wire, wherein a portion of the second dielectric layer remains over the cavity and seals the cavity.

17. The method of claim 1, wherein the intercalating the plurality of graphene layers with the one or more metals forms a metal-graphene composite, wherein the first wire comprises the metal-graphene composite, and wherein the metal-graphene composite is directly on the metal interconnect and the first dielectric layer.

18. The method of claim 9, further comprising:
forming a hard mask over the plurality of graphene layers, wherein the hard mask is over the plurality of graphene layers during the etching the plurality of graphene layers, and wherein the hard mask is over the first graphene stack during the intercalating the metal between the graphene layers of the first graphene stack.

19. The method of claim 16, wherein depositing the second metal between the graphene sheets of the first segment of the second stack of graphene sheets comprises intercalating the second metal is between a first graphene sheet and a second graphene sheet of the first segment of the second stack of graphene sheets, and wherein the first graphene sheet is directly on the upper surface of the metal via and the upper surface of the first dielectric layer.

20. The method of claim 16, wherein the semiconductor device is coupled to the second wire by the first wire and the metal via.

* * * * *